(12) United States Patent
Wang et al.

(10) Patent No.: US 11,029,331 B2
(45) Date of Patent: Jun. 8, 2021

(54) UNIVERSAL TEST MECHANISM FOR SEMICONDUCTOR DEVICE

(71) Applicant: TAIWAN SEMICONDUCTOR MANUFACTURING CO., LTD., Hsinchu (TW)

(72) Inventors: Mill-Jer Wang, Hsinchu (TW); Chi-Che Wu, Hsinchu (TW); Hung-Chih Lin, Hsinchu (TW); Hao Chen, New Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 78 days.

(21) Appl. No.: 15/434,099

(22) Filed: Feb. 16, 2017

(65) Prior Publication Data

US 2018/0164343 A1    Jun. 14, 2018

Related U.S. Application Data

(60) Provisional application No. 62/431,900, filed on Dec. 9, 2016.

(51) Int. Cl.
| | |
|---|---|
| *G01R 1/04* | (2006.01) |
| *H01L 25/10* | (2006.01) |
| *H05K 1/02* | (2006.01) |
| *H05K 1/11* | (2006.01) |
| *H01L 23/498* | (2006.01) |

(52) U.S. Cl.
CPC .......... *G01R 1/0466* (2013.01); *H01L 25/105* (2013.01); *H05K 1/0268* (2013.01); *G01R 1/0483* (2013.01); *H01L 23/49816* (2013.01); *H01L 23/49822* (2013.01); *H01L 2224/16225* (2013.01); *H01L 2225/1041* (2013.01); *H01L 2225/1058* (2013.01); *H01L 2924/15174* (2013.01); *H05K 1/111* (2013.01); *H05K 2201/09227* (2013.01); *H05K 2201/10734* (2013.01)

(58) Field of Classification Search
CPC ........................... G01R 1/0466; H01L 25/105
See application file for complete search history.

(56) References Cited

U.S. PATENT DOCUMENTS

| | | | | |
|---|---|---|---|---|
| 4,997,377 | A * | 3/1991 | Goto | H05K 1/118 439/493 |
| 5,213,512 | A * | 5/1993 | Campbell | H01R 12/592 439/493 |
| 6,452,807 | B1 * | 9/2002 | Barrett | G01R 1/0416 257/686 |
| 7,098,680 | B2 * | 8/2006 | Fukushima | G01R 31/2889 324/756.02 |

(Continued)

*Primary Examiner* — Paresh Patel
(74) *Attorney, Agent, or Firm* — McClure, Qualey & Rodack, LLP

(57) ABSTRACT

A semiconductor device includes a circuit board, a semiconductor package, and a contact interface. The semiconductor package is mounted on the circuit board. The semiconductor package includes a plurality of conductive bumps with a first pitch. The contact interface is electrically connected to the circuit board. The contact interface includes a plurality of first contact pads with a second pitch substantially the same as the first pitch. The first contact pads are separated from the conductive bumps.

20 Claims, 13 Drawing Sheets

(56) References Cited

U.S. PATENT DOCUMENTS

| | | | |
|---|---|---|---|
| 7,528,616 B2* | 5/2009 | Grilletto | G01R 1/0433 |
| | | | 324/754.18 |
| 8,704,350 B2* | 4/2014 | Park | H01L 21/563 |
| | | | 257/678 |
| 8,952,516 B2* | 2/2015 | Zohni | H01L 23/13 |
| | | | 257/668 |

* cited by examiner

UNIVERSAL TEST MECHANISM FOR SEMICONDUCTOR DEVICE

PRIORITY CLAIM AND CROSS-REFERENCE

This application claims priority to U.S. Provisional Application Ser. No. 62/431,900, filed Dec. 9, 2016, which is herein incorporated by reference.

BACKGROUND

In integrated circuit (IC) manufacturing, testing is a step to ensure the functionality of a device. In a testing procedure, a tester is configured to generate testing signals. The tester is coupled to a prober with probes that provide testing signals for a device-under-test (DUT). The probes are designed corresponding to a specific IC design of the DUT. For example, the probes are designed corresponding to conductive bumps of a semiconductor package.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
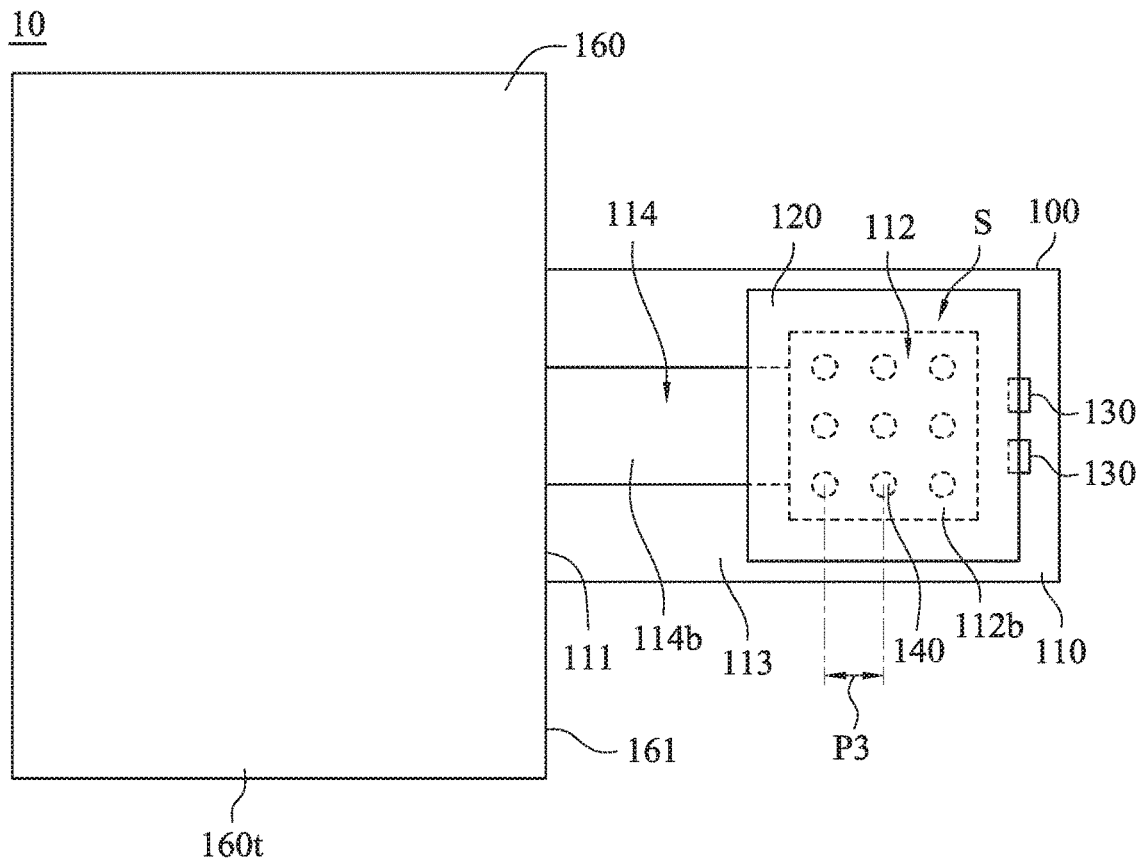
FIG. 1 is a plan view of a test device capable of testing a DUT in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2:
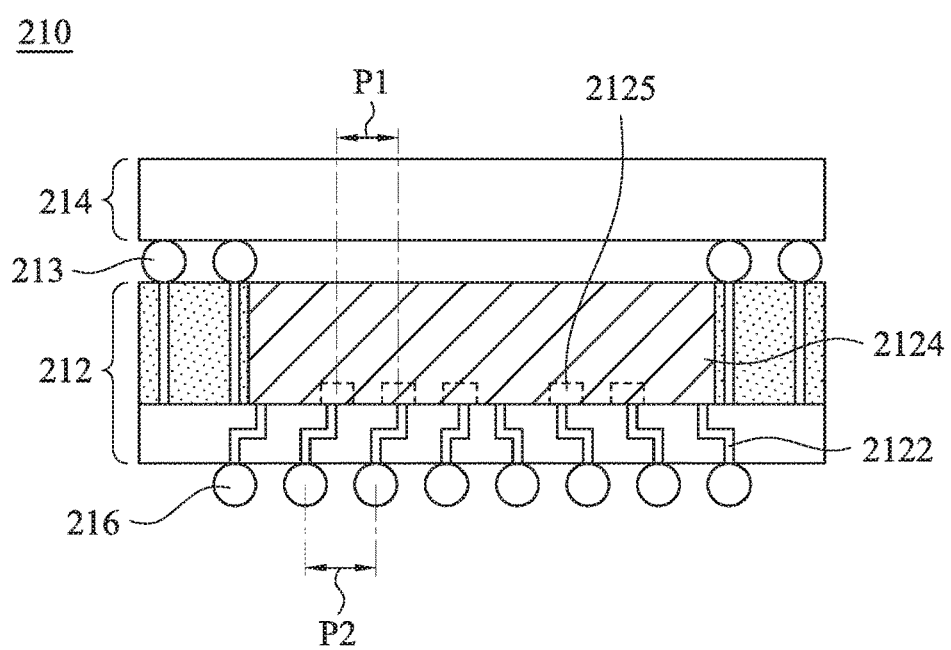
FIG. 2 is a cross-sectional view of an InFO PoP device in accordance with some embodiments of the present disclosure.

Universal test mechanisms suitable for testing various devices-under-test (DUTs) are disclosed herein, wherein the DUTs may be, for example, semiconductor packages or circuit boards with semiconductor packages thereon. FIG. 1 illustrates a test device 10 capable of testing DUT in accordance with some embodiments. The test device 10 incudes a test socket 100 for testing the DUT. The test socket 100 includes a bottom fixture 110 having a recess 112 (or a carved out space) in a top surface 113 of the bottom fixture 110 to accommodate the device-under-test (DUT), such as an integrated fan-out (InFO) package on package (PoP) device 210 as shown in FIG. 2, during testing. Test socket 100 includes a cover 120 over the bottom fixture 110. The cover 120 and the underlying bottom fixture 110 define an accommodating space S therebetween, and the accommodating space S is communicated with the underlying recess 122. As such, the cover 120 can protect the DUT accommodated in the accommodating space S during testing. The test device 10 incudes a plurality of probes 140 in the accommodating space S. The probes 140 can be but are not limited to pogos or super buttons used for testing of the DUT.

The cover 120 is movable with respect to the bottom fixture 110, so that the test socket 100 can be opened for placing the DUT. For example, in some embodiments, the cover 120 may be pivotally connected to the bottom fixture 110, and hence the cover 120 is rotatable with respect to the bottom fixture 110. That is to say, the bottom fixture 110 and the cover 120 are connected with each other via one or more pivot joints 130, so that the test socket 100 can be opened for placement of the DUT into the accommodating space S. In some other embodiments, the test socket 100 can be opened by detaching the cover 120 from the bottom fixture 110, instead of rotating the cover 120.

In some embodiments, the InFO PoP device 210 includes a bottom semiconductor package 212 and a top semiconductor package 214 vertically stacked over the bottom package 212, as shown in FIG. 2. The top semiconductor package 214 is electrically connected to the bottom semiconductor package 212 via conductive bumps 213 or other suitable electrical connectors, such as copper columns, copper studs, controlled collapse chip connectors ("C4"), interposed between the packages 212 and 214. The InFO PoP device 210 includes bottom conductive bumps 216 formed on a bottom side of the bottom package 212. By using redistribution lines 2122 in the bottom package 212, pitch P1 of contact pads 2125 of semiconductor chip 2124 in the bottom package 212 can be fanned out to the pitch P2 of the bottom conductive bumps 216. The bottom conductive bumps 216 can be used to respectively contact with probes 140 of the test socket 100 during testing of the InFO PoP device 210. As such, pitch P3 of the probes 140 may be equal to or less than that of the bottom conductive bumps 216, so as to ensure that all bottom conductive bumps 216 can be probed by the probes 140. In some embodiments, the conductive bumps 216 may be conductive balls, such as solder balls, arranged in a grid pattern of rows and columns, and hence they can form a ball grid array (BGA). In some embodiments, the conductive bumps 216 can include, for example, as a lead-free alloy (e.g., gold (Au), a tin/silver/copper (Sn/Ag/Cu) alloy, or other lead-free alloys), a lead-containing alloy (e.g., a lead/tin (Pb/Sn) alloy), copper, aluminum, aluminum copper, conductive polymer, other bump metal materials, or any combinations thereof.

Figure 3:
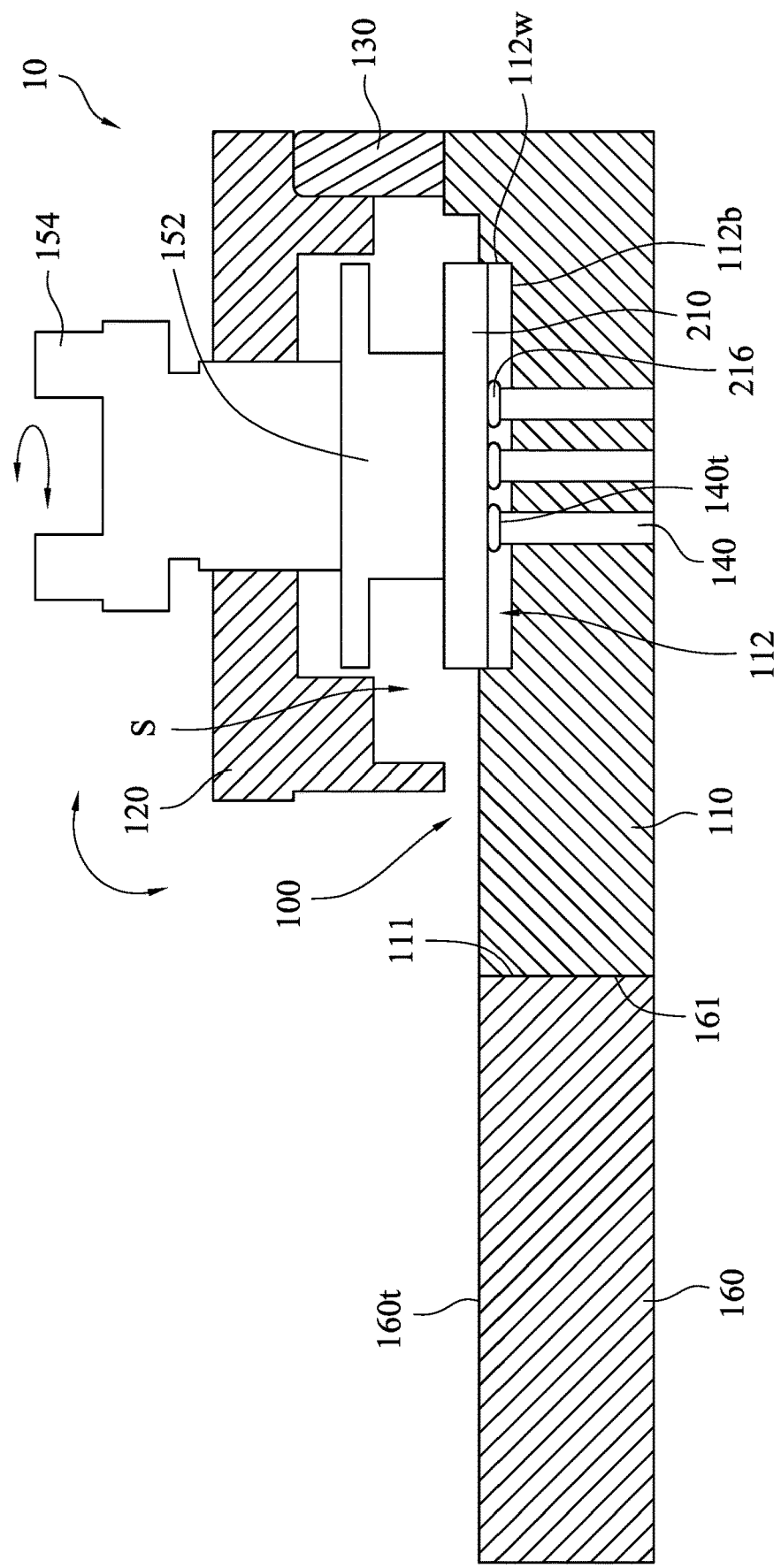
FIG. 3 shows how the InFO PoP device in FIG. 2 is placed in the test device in FIG. 1 for testing in accordance with some embodiments of the present disclosure.

FIG. 3 shows how InFO PoP device 210 is placed between the bottom fixture 110 and the cover 120 of the test socket 100 for testing. As shown in FIG. 3, the InFO PoP device 210 is placed in the recess 112, and the bottom conductive bumps 216 of the InFO PoP device 210 are respectively in contact with the probes 140 in bottom fixture 110, so that each of the bottom conductive bumps 216 can be probed during testing. For example, the test socket 100 may include a pusher 152 and a control knob 154 coupled to the pusher 152. The pusher 152 is over the recess 112 when the recess 112 is covered by the cover 120. The control knob 154 can be rotated to move the pusher 152 downwardly to push the InFo PoP device 210 against the probes 140, so as to make sure that the bottom conductive bumps 216 are in contact with the probes 140. In some embodiments, the probes 140 have top ends 140*t* higher than a bottom surface 112*b* of the recess 112, and the probes 140 are resiliently retractable with respect to the bottom surface 112*b,* so that the probes 140 may be retracted by the pushing of the bottom conductive bumps 216.

Figure 4:
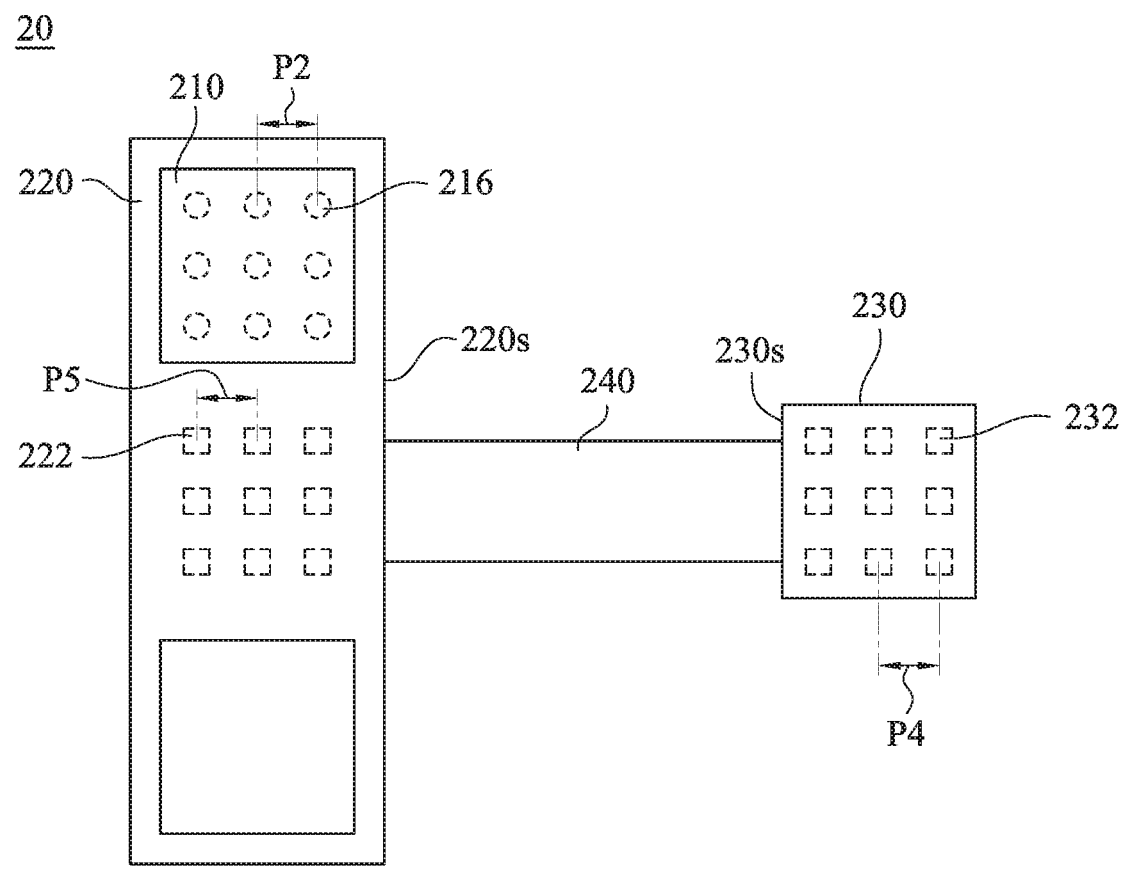
FIG. 4 is a plan view of a semiconductor device with an InFO PoP device thereon in accordance with some embodiments of the present disclosure.

In some embodiments, the InFO PoP device 210 is held by a surrounding wall 112*w* of the recess 112, so that the InFO PoP device 210 can be steadily placed on the bottom fixture 110. In other words, the surrounding wall 112*w* of recess 112 has geometry substantially the same as that of sidewall of the InFO PoP device 210, so that the InFO PoP device 210 can be fitted into the recess 112 for testing. Since the surrounding wall 112*w* of the recess 112 is designed to fit the InFO PoP device 210, the recess 122 has a size similar to that of the InFO PoP device 210. If one or more InFO PoP devices 210 are to be mounted on a circuit board, such as circuit board 220 shown in FIG. 4, to form a semiconductor device 20 as shown in FIG. 4, a size of the circuit board 220 is significantly greater than that of the InFO PoP device 210, so as to provide a land large enough for mounting one or more InFO PoP devices 210. The recess 112 with size similar to that of the InFO PoP device 210, however, is too small to receive the circuit board 220 for probing contact pads 222 of the circuit board 220. Therefore, as shown in FIGS. 1 and 4, the test device 10 includes a jig 160 for holding the circuit board 220, so that a small contact interface 230, which mimics contour of the InFO PoP device 210 and electrically connects to the circuit board 220, can be placed in the recess 112 for probing or testing, while leaving the circuit board 220 to stay on the jig 160.

As illustrated in FIG. 1, the test socket 100 is connected to the jig 160. For example, the test socket 100 and the jig 160 are arranged in a side-by-side arrangement and abut each other. More particularly, the bottom fixture 110 of the test socket 100 includes a sidewall 111 attached to a sidewall 161 of the jig 160. The sidewall 161 may include an area greater than that of the sidewall 111, so that the bottom fixture 110 may protrude from the sidewall 161 of the jig 160. The jig 160 is free from coverage of the cover 120, so that the circuit board 220 can be free from covered by the cover 120 during probing the contact interface 230. The jig 160 has a size greater than that of the recess 112 in the bottom fixture 110, so that the circuit board 220 can be placed on the jig 160 even if the circuit board 220 has larger size than that of the recess 112. For example, the jig 160 has a top surface 160*t* with greater area than that of a bottom surface 112*b* of the recess 112, so that the circuit board 220 with larger size than that of the recess 112 can be placed on and supported by the top surface 160*t* of the jig 160, while leaving the contact interface 230 in the recess 112 for probing or testing. In other words, the top surface 160*t* has greater area than that of a bottom surface of the circuit board 220, so as to support the circuit board 220. In this way, the test device 10 can serve as a universal test device suitable for testing either the InFO PoP device 210 or the circuit board 220. In some embodiments, the jig 160 may include a recess (not shown) in the top surface 160*t* with a surrounding wall for holding the circuit board 220.

In some embodiments, the bottom fixture 110 has a groove 114 in the top surface 113 of the bottom fixture 110. The groove 114 laterally extends from the recess 112 to the top surface 160*t* of jig 160 and hence is communicated with the recess 112. The communication of the groove 114 and recess 112 may be advantageous such that when the contact interface 230 is placed in the recess 112 and covered by the cover 120, a connector 240 connected between the circuit board 220 and the contact interface 230 can be accommodated or received in the groove 114. In other words, the connector 240 laterally extending from the circuit board 220 to the contact interface 230 will not be interfered by the cover 120 because the connector 240 is accommodated or received in the groove 114. Stated differently, in some embodiments, the connector 240 protrudes from a sidewall 220*s* of the circuit board 220 to a sidewall 230*s* of the contact interface 230, and the connector 240 will not be pressed by the cover 120 as the cover 120 covers the contact interface 230 because the connector 240 is placed in the groove 114 during testing.

Figure 5:
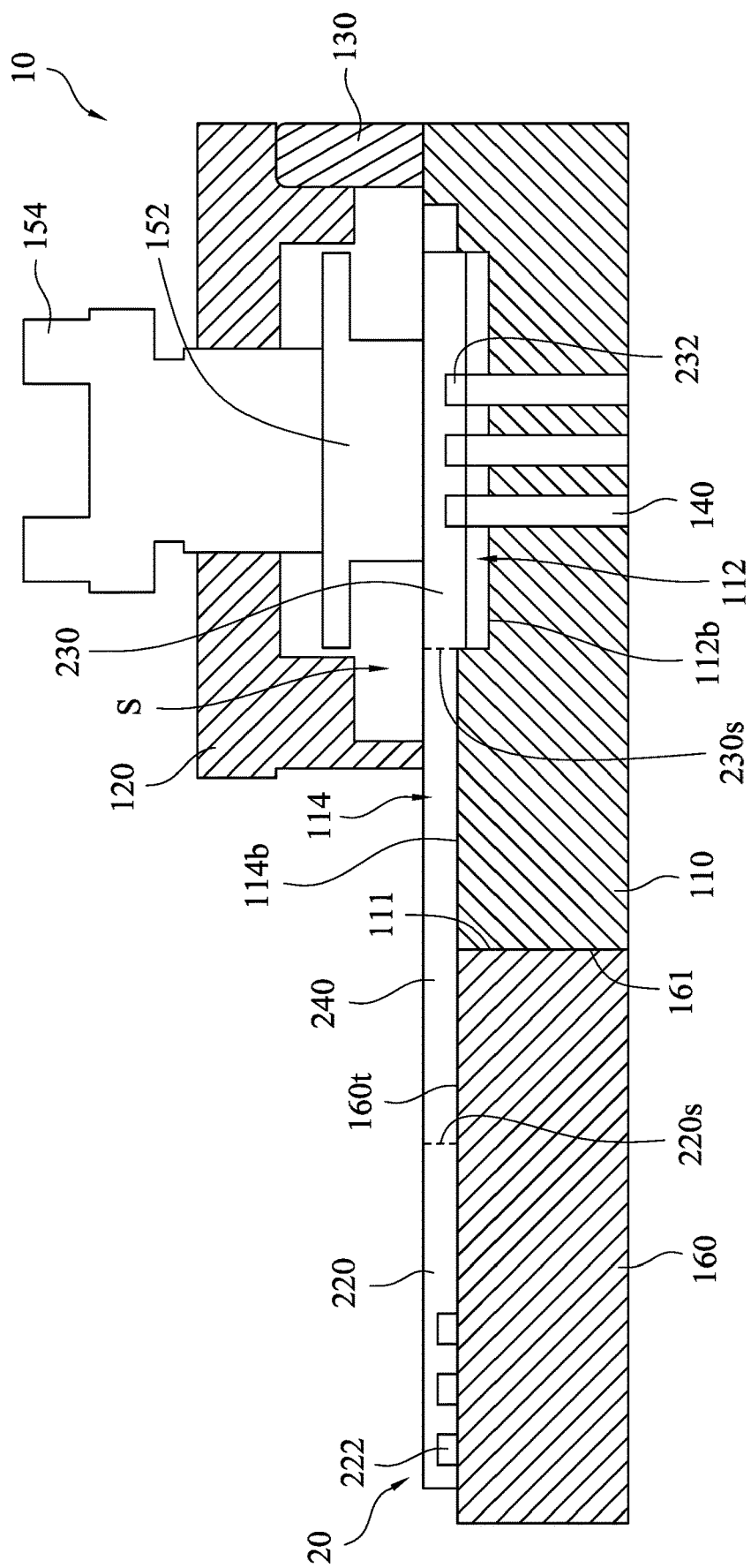
FIG. 5 shows how the semiconductor device in FIG. 4 is placed on the test device in FIG. 1 in accordance with some embodiments of the present disclosure.

For example, reference can be made to FIG. 5, which shows how the semiconductor device 20 is placed on the test device 10. As shown in FIG. 5, the contact interface 230 of the semiconductor device 20 is placed in the recess 112 in the bottom fixture 110 and over the probes 140, a portion of the connector 240 of the semiconductor device 20 is placed in the groove 114 in the bottom fixture 110, another portion of the connector 240 is placed over the jig 160, and the circuit board 220 is placed over the jig 160. As the cover 120 covers the contact interface 230, a portion of the connector 240 laterally extends from the sidewall 230s of the contact interface 230 to outside of the accommodating space S along the groove 114, and the portion of connector 240 is connected to the sidewall 220s of circuit board 220. Therefore, electrical connection between the circuit board 220 and the contact interface 230 will not be interfered by the cover 120 because top edges of the groove 114 can protect the connector 240 from the pressing of the cover 120. In some embodiments, the control knob 154 can be rotated to move the pusher 152 to push the contact interface 230 against the probes 140, while the circuit board 220 and connector 240 are free from the pushing of the pusher 152. In some embodiments where the probes 140 are resiliently retractable probes, the probes 140 may be retracted due to the pushing of the contact interface 230.

In some embodiments, the contact interface 230 includes a plurality of contact pads 232. Pitch P4 of the contact pads 232 and pitch P2 of the bottom conductive bumps 216 of the InFO PoP device 210 are substantially the same, as shown in FIG. 4. For example, in depicted embodiments in FIG. 4, the contact pads 232 of the contact interface 230 may be arranged in a 3×3 matrix, the bottom conductive bumps 216 of the InFO PoP device 210 are arranged in a 3×3 matrix with substantially the same pitch as the matrix of the contact pads 232. That is to say, the contact pads 232 and bottom conductive bumps 216 can be arranged in substantially the same pattern and pitch, as examples. By using such a configuration, the probes 140 can either probe bottom conductive bumps 216 during testing the InFO PoP device 210 or probe contact pads 232 of the contact interface 230 during testing the circuit board 220. More particularly, if the contact pads 232 and the bottom conductive bumps 216 have different pitches, it would be difficult for designing or arranging the probes 140 to be universally adaptable for probing all contact pads 232 or all bottom conductive bumps 216. On the other hand, if the contact pads 232 and the bottom conductive bumps 216 have substantially the same pitch, the probes 140 can be designed and arranged to be universally adaptable for probing either all bottom conductive bumps 216 or all contact pads 232. Therefore, substantially the same pitch of the contact pads 232 and the bottom conductive bumps 216 may be advantageous to design or arrange universally adaptable probes 140 for testing semiconductor packages or circuit board with semiconductor packages thereon. In some embodiments, because the contact interface 230 is separated from the circuit board 220 by the connector 240, the contact pads 232 are separated from the bottom conductive bumps 216 mounted on the circuit board 220.

In some embodiments, since the pitch P2 of the bottom conductive bumps 216 are substantially the same as that of the contact pads 232, and the pitch P2 of the conductive bumps 216 is different from that of contact pads 2125 of semiconductor chip 2124 (shown in FIG. 2) in the InFO PoP device 210 due to fan-out design, the pitch P4 of the contact pads 232 is different from that of the contact pads 2125 of the semiconductor chip 2124 as well. For example, the pitch P2 of conductive bumps 216 is greater than that of the contact pads 2125 of the semiconductr chip 2124 for the fan-out design, and hence the pitch P4 of contact pads 232 is greater than that of the contact pads 2125 of the semiconductor chip 2124 because the contact pads 232 and the conductive bumps 216 have substantially the same pitch.

In some embodiments, as shown in FIG. 5, the groove 114 has a bottom surface 114b substantially coplanar with or level with the top surface 160t of the jig 160. As a result, the connector 240 and the circuit board 220 can be placed on the test device 10 in a substantial coplanar fashion. The semiconductor device 20 can thus be substantially free from generation of creases or wrinkles in transition region between the connector 240 and the circuit board 220 when the semiconductor device 20 is placed on the test device 10. This is due to the substantial coplanarity of the top surface 160t of the jig 160 and the bottom surface 114b of the groove 114. Since the transition region between the connector 240 and the circuit board 220 is substantially free from creases or wrinkles, damage to electrical connection between the circuit board 220 and connector 240 can be prevented when the semiconductor device 20 is placed on the test device 10.

In some embodiments, as shown in FIGS. 1 and 5, the recess 112 may be formed in the bottom surface 114b of the groove 114, so that the recess 112 can either accommodate the InFO PoP device 210 or the contact interface 230 connected to the connector 240. In other words, the bottom surface 112b of the recess 112 is lower than the bottom surface 114b of the groove 114. Stated differently, the bottom fixture 110 has a step height between the bottom surfaces 112b and 114b. Moreover, since the top surface 160t of the jig 160 is substantially coplanar with the bottom surface 114b of the groove 114, the top surface 160t of the jig 160 is higher than the bottom surface 112b of the recess 112. In this way, when the semiconductor device 20 is placed on the test device 10 as illustrated in FIG. 5, the circuit board 220 is supported by the top surface 116t of the jig 116, the connector 240 is supported by the top surface 116t of the jig 116 and the bottom surface 114b of the groove 114, and the contact interface 230 is supported by the probes 140, rather than the bottom surface 112b of the recess 112. In other words, the contact interface 230 may be spaced apart from the bottom surface 112b of the recess 112 by the probes 140.

In some embodiments, as shown in FIG. 4, the circuit board 220 includes a plurality of contact pads 222. The contact pads 222 are electrically connected to the contact pads 232 of the contact interface 230, respectively. Stated in a different way, the contact pads 222 are electrically connected to the contact pads 232 in a one-to-one manner. Therefore, each contact pad 222 of the circuit board 220 is electrically connected to a corresponding contact pad 232 of the contact interface 230, and hence functionality of each contact pad 222 can be tested as its corresponding contact pad 232 is probed by the probe 140, even if the contact pads 222 are not in contact with the probes 140. In other words, the contact pads 222 of the circuit board 220 or circuitry connected to the contact pads 222 can be tested by probing the contact pads 232 of the contact interface 230. Therefore, an electrical test of the circuit board 220 can be performed without probing the circuit board 220, and hence the circuit board 200 can be stay outside the test socket 100 during the electrical test.

Figure 6:
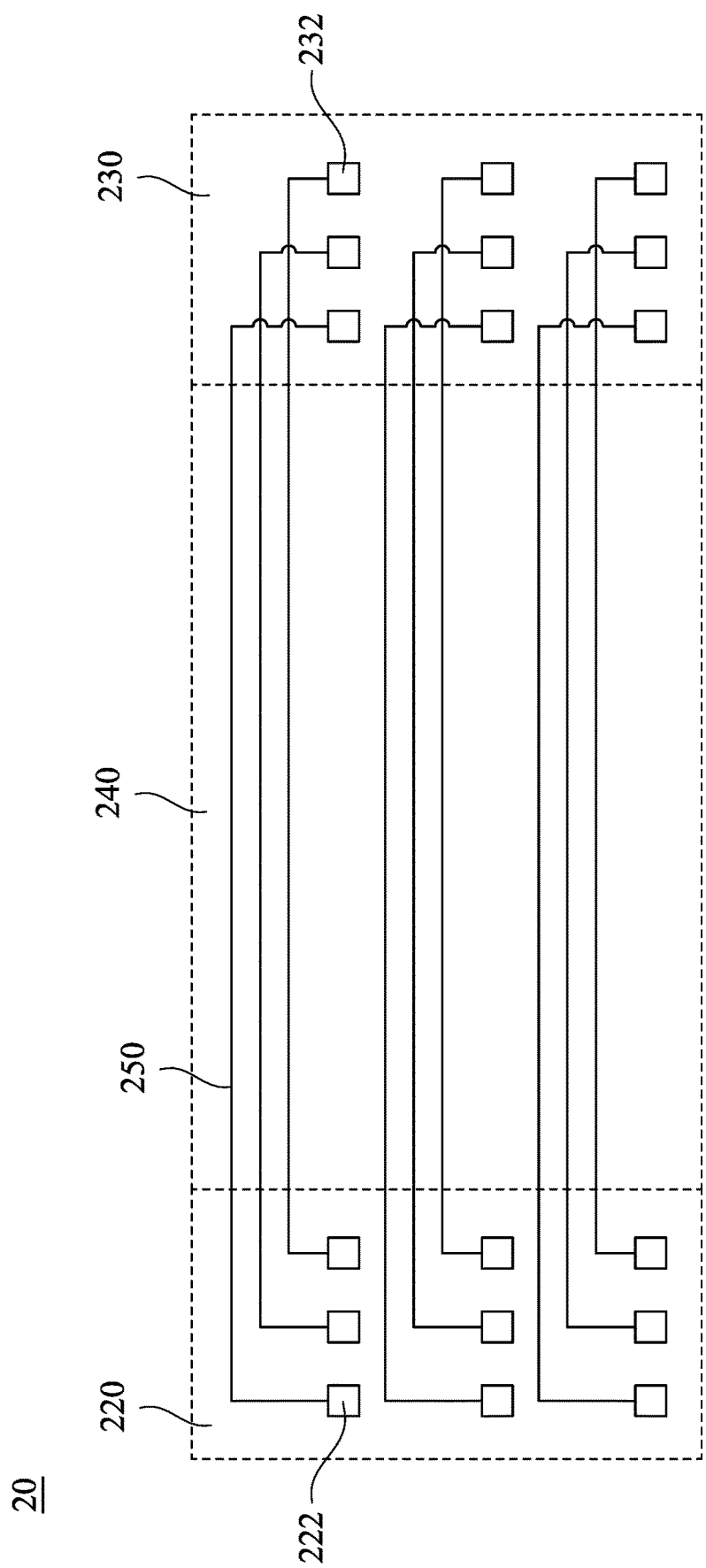
FIG. 6 illustrates electrical connections between the contact pads of the circuit board and the contact pads of the contact interface in accordance with some embodiments of the present disclosure.

FIG. 6 illustrates electrical connections between the contact pads 222 of the circuit board 220 and the contact pads 232 of the contact interface 230 in accordance with some embodiments of the present disclosure. The semiconductor device 20 includes a plurality of signal channels 250 respectively connecting the contact pads 222 to the contact pads 232. That is to say, each contact pad 222 of the circuit board 220 can be electrically connected to a corresponding contact pad 232 of the contact interface 230 via a signal channel 250. The signal channels 250 have substantially the same length, and hence signal losses caused by different signal channels 250 may be substantially the same. Therefore, differences of electrical parameters between the contact pads 232 measured by the probes 140, such as measured voltage differences or the like, can be substantially the same as differences of the electrical parameters between the contact pads 222 of the circuit board 220, so that signal distortions caused by the signal channels 250 extending outside the circuit board 220 can be suppressed. In some embodiments, the signal channels 250 may be signal lines, such as metal lines, and theses signal lines respectively extend from contact pads 232 to the circuit board 220 through the connector 240. Stated differently, the signal channels 250 may be signal lines embedded in or attached to the connector 240. These signal lines have substantially the same length to reduce or suppress signal distortions as discussed above. In some embodiments, the semiconductor device 20 may include a plurality of shielding structures (not shown) around the signal channels 250. These shielding structures can be grounded, so as to reduce noises on the signal channels 250.

In the depicted embodiments, the contact pads 232 of the contact interface 230 are illustrated with the pitch P4 substantially the same as the pitch P5 of the contact pads 222 of the circuit board 220. In some other embodiments, the contact pads 232 and the contact pads 222 can have different pitches. In some embodiments, the pitch of the contact pads 222 is designed such that the signal channels 250 are routed in substantially the same length, and such a pitch of the contact pads 222 may be different from that of the contact pads 232 of the contact interface 230. In such embodiments, the pitch of the contact pads 222 of the circuit board 220 is different from that of the bottom conductive bumps 216 of the InFO PoP device 210 as well. This is due to the fact that the contact pads 232 of the contact interface 230 has pitch substantially the same as that of the bottom conductive bumps 216 and different from that of the contact pads 222 of the circuit board 220.

Figure 7:
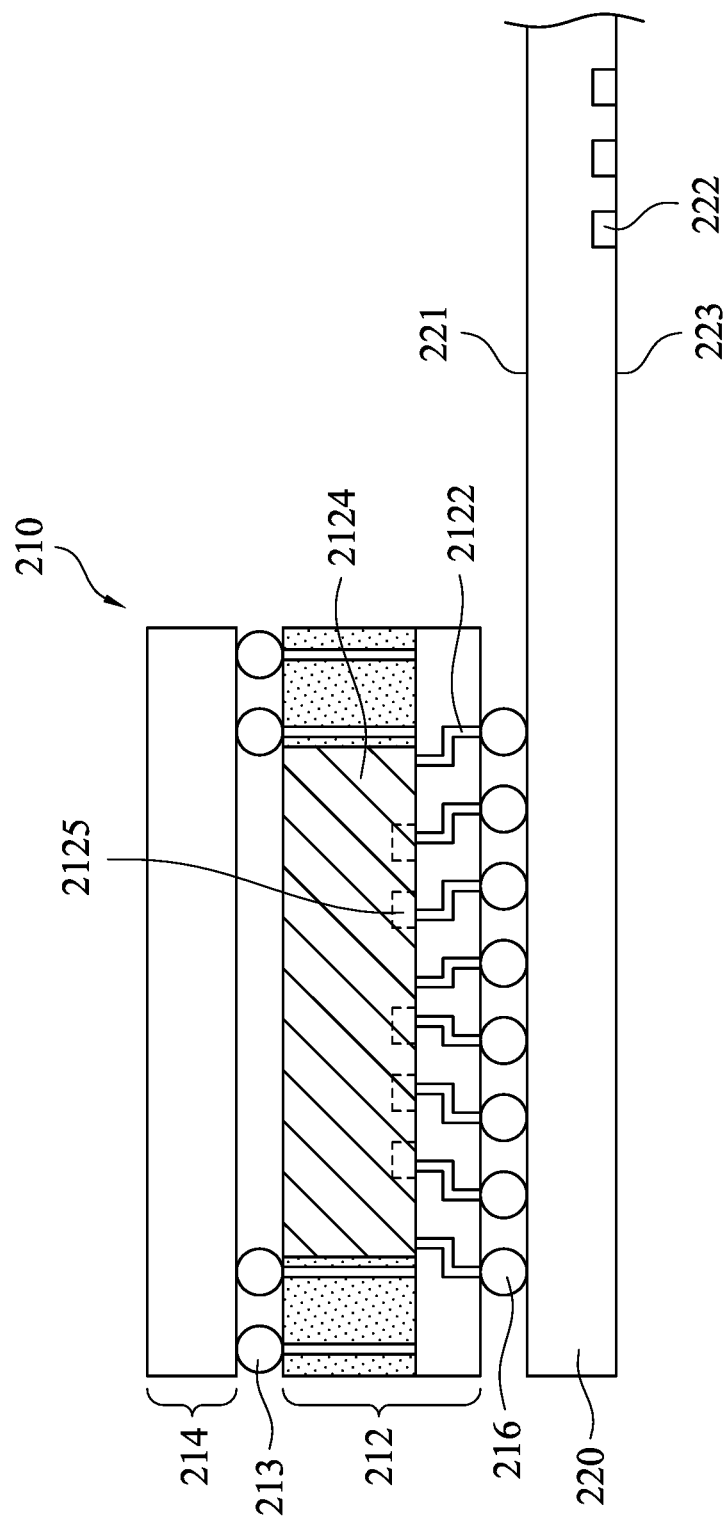
FIG. 7 is a cross-sectional view of a circuit board with InFO PoP device mounted thereon in accordance with some embodiments of the present disclosure.

In some embodiments, one or more InFO PoP devices 210 are mounted on top side of the circuit board 220, such as printed circuit board (PCB), flexible circuit board (FPC), or the like, and the contact pads 222 are formed on bottom side of the circuit board 220, as shown in FIG. 7. For example, the circuit board 220 includes opposite top and bottom surfaces 221 and 223. The InFO PoP device 210 is mounted on the top surface 221 of the circuit board 220 via the bottom conductive bumps 216, and the contact pads 222 are formed on the bottom surface 223 of the circuit board 220. In some embodiments, the contact pads 222 are exposed on the bottom surface 223 of the circuit board 220 for electrical connecting to external devices (not shown). The conductive bumps 216 over the top surface 221 and the contact pads 222 on the bottom surface 223 can be electrically connected via metal lines or patterns in the circuit board 220.

Figure 8:
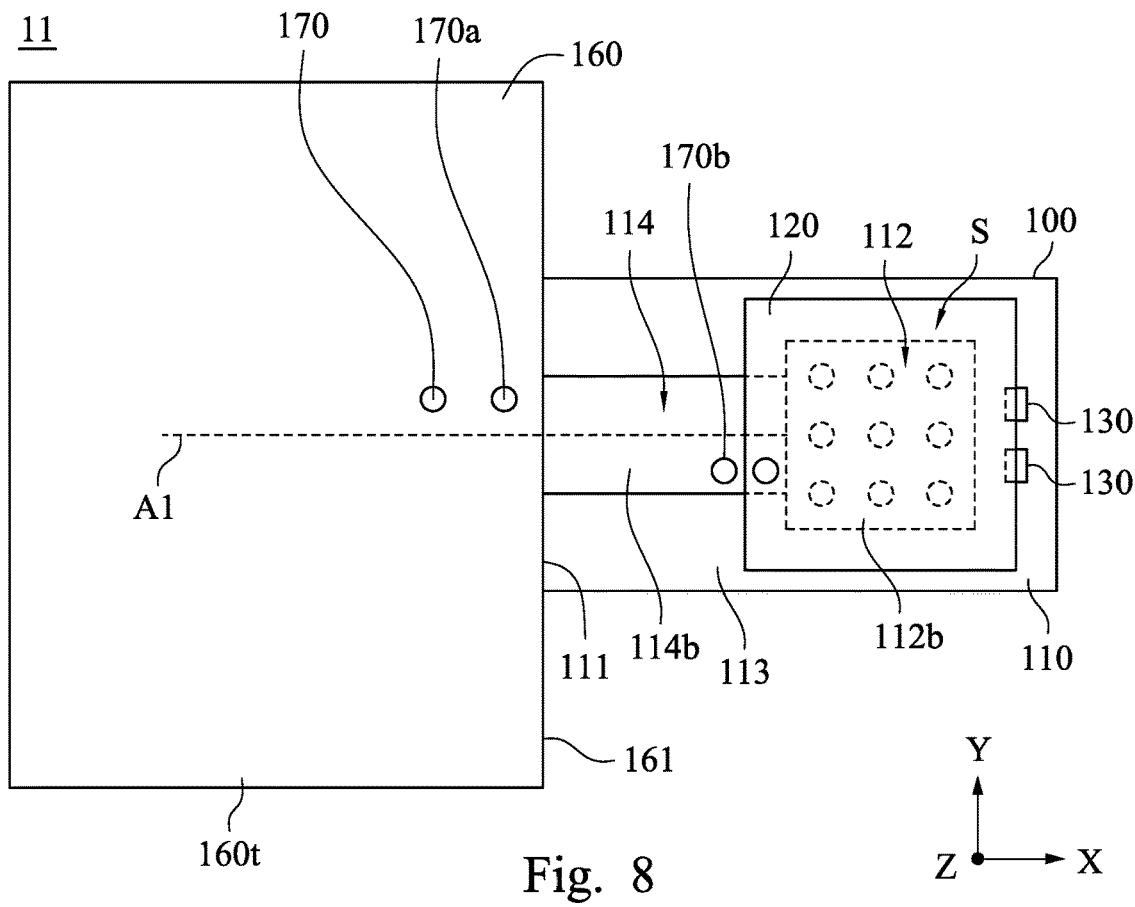
FIG. 8 is a plan view of a test device in accordance with some embodiments.
Figure 9:
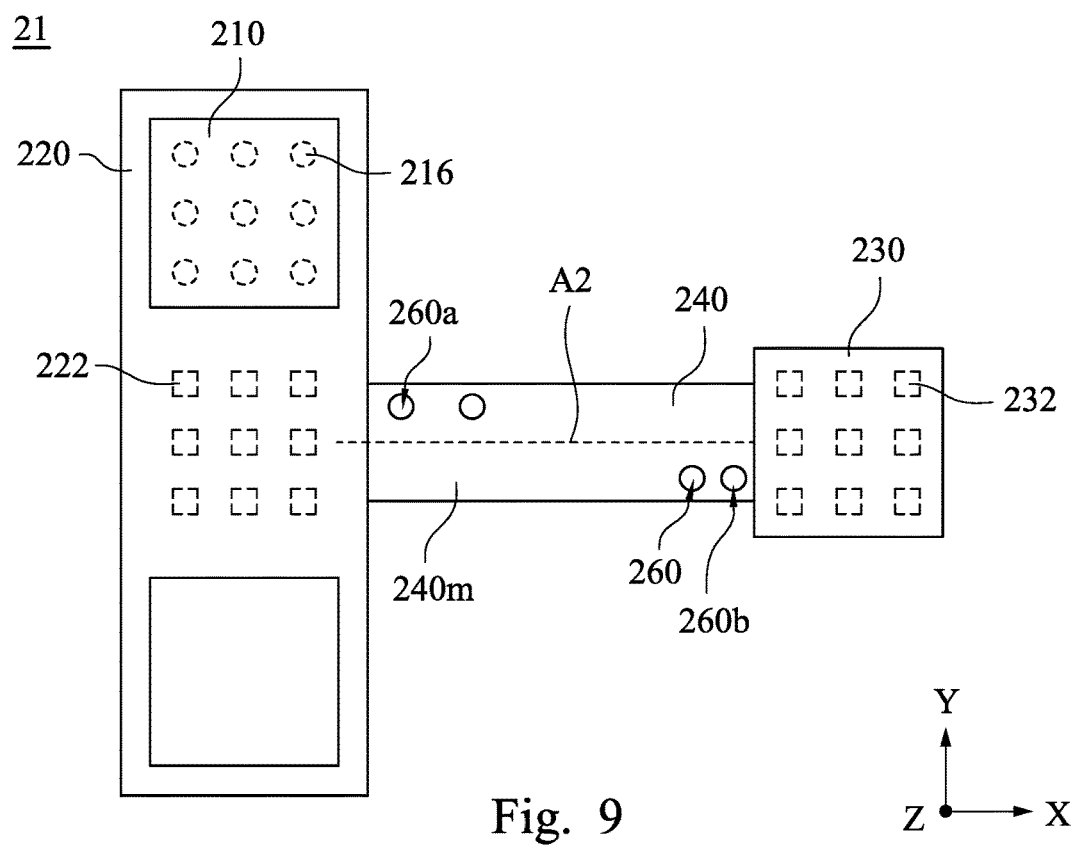
FIG. 9 is a plan view of a semiconductor device that can be tested by the test device shown in FIG. 8.

FIG. 8 illustrates a test device 11 capable of testing DUT in accordance with some embodiments, and FIG. 9 illustrates a semiconductor device 21 that can be tested by the test device 11. FIGS. 8 and 9 further depict X direction (or a first horizontal direction), Y direction (or a second horizontal direction), and Z-axis directions (or a vertical direction). As shown in FIG. 8, the test device 11 includes the test socket 100 and the jig 160 as discussed previously, and moreover, the test device 11 additionally includes guide features 170 arranged on the bottom surface 114b of the groove 114, the top surface 160t of the jig 160, or a combination thereof. As shown in FIG. 9, the semiconductor device 21 includes the InFO PoP device 210, the circuit board 220, the contact interface 230 and the connector 240 as discussed previously. Moreover, the semiconductor device 21 additionally includes guide features 260 arranged on a major surface 240m of the connector 240. The guide features 260 are arranged in substantially the same pattern as that of the guide features 170 of the test device 11, and hence the guide features 170 and 260 may be advantageous for precise orientation of the semiconductor device 21 and the test device 11. For example, the guide features 170 may be guide pins protruding from the bottom surface 114b of groove 114, the top surface 160t of the jig 160, or a combination thereof, the guide features 260 may be guide holes formed in the major surface 240m of the connector 240, and the guide pins and guide holes have substantially the same geometry, so that the guide pins can be respectively fitted into the guide holes. For example, the guide holes may be circular holes, rectangular holes, other polygonal holes, or the like, and the guide pins may be pillars with substantially the same geometry as that of the guide holes.

Figure 10:
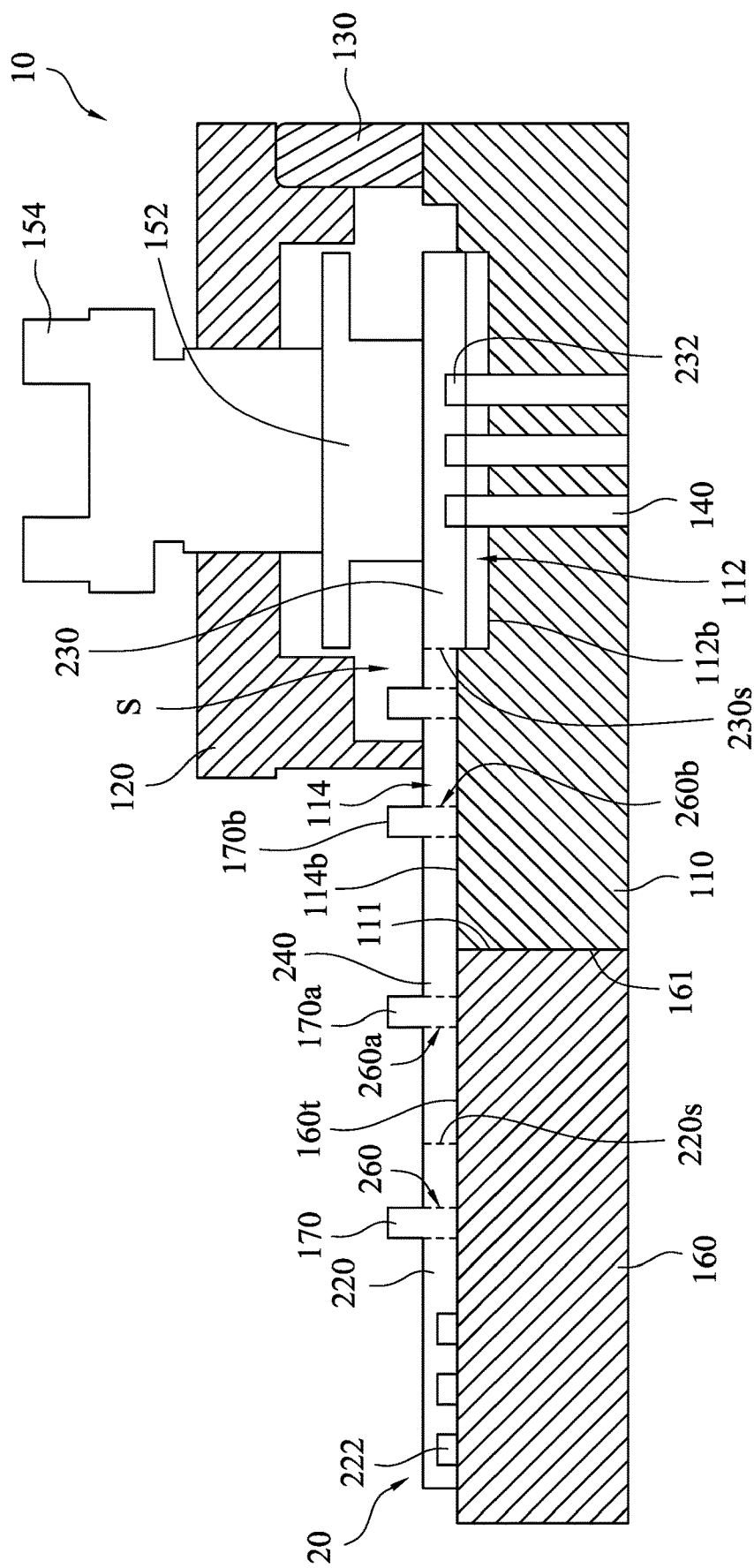
FIG. 10 shows how the semiconductor device in FIG. 9 is placed on the test device in FIG. 8 in accordance with some embodiments of the present disclosure.

In some embodiments, the guide features 170 are arranged asymmetrically with respect to a longitudinal axis A1 (parallel to the X direction) of the bottom surface 114b of the groove 114, and the guide features 260 are arranged asymmetrically with respect to a longitudinal axis A2 of the major surface 240m of the connector 240. For example, the guide features 170a on one side of the longitudinal axis A1 of bottom surface 114b of groove 114 can be arranged in a pattern different from that of the guide features 170b on the other side of the longitudinal axis A1. Similarly, the guide features 260a on one side of the longitudinal axis A2 (parallel to the X direction) of the connector 240 can be arranged in a pattern different from that of the guide features 260b on the other side of the longitudinal axis A2. The guide features 170a and 260a are arranged in substantially the same pattern, and the guide features 170b and 260b are arranged in substantially the same pattern. Therefore, the guide features 170a can be fitted into the guide features 260a but cannot be fitted into the guide features 260b, and similarly, the guide features 170b can be fitted into the guide features 260b but cannot be fitted into the guide features 260a, as shown in FIG. 10. Accordingly, by such an asymmetric configuration, the guide features 170 and 260 can be advantageous for foolproof placement of the semiconductor device 21 onto the test device 11, so as to ensure that the contact interface 230 is correctly placed on the test socket 100 and the circuit board 220 is correctly placed on the jig 160.

As shown in FIG. 10, in the depicted embodiments, the guide holes 260 are through holes that can be respectively penetrated through by the guide pins 170. In some other embodiments, the guide holes 260 are blind holes that can be respectively inserted by the guide pins 170. That is, the guide holes 260 may not be penetrated by the guide pins 170.

Figure 11:
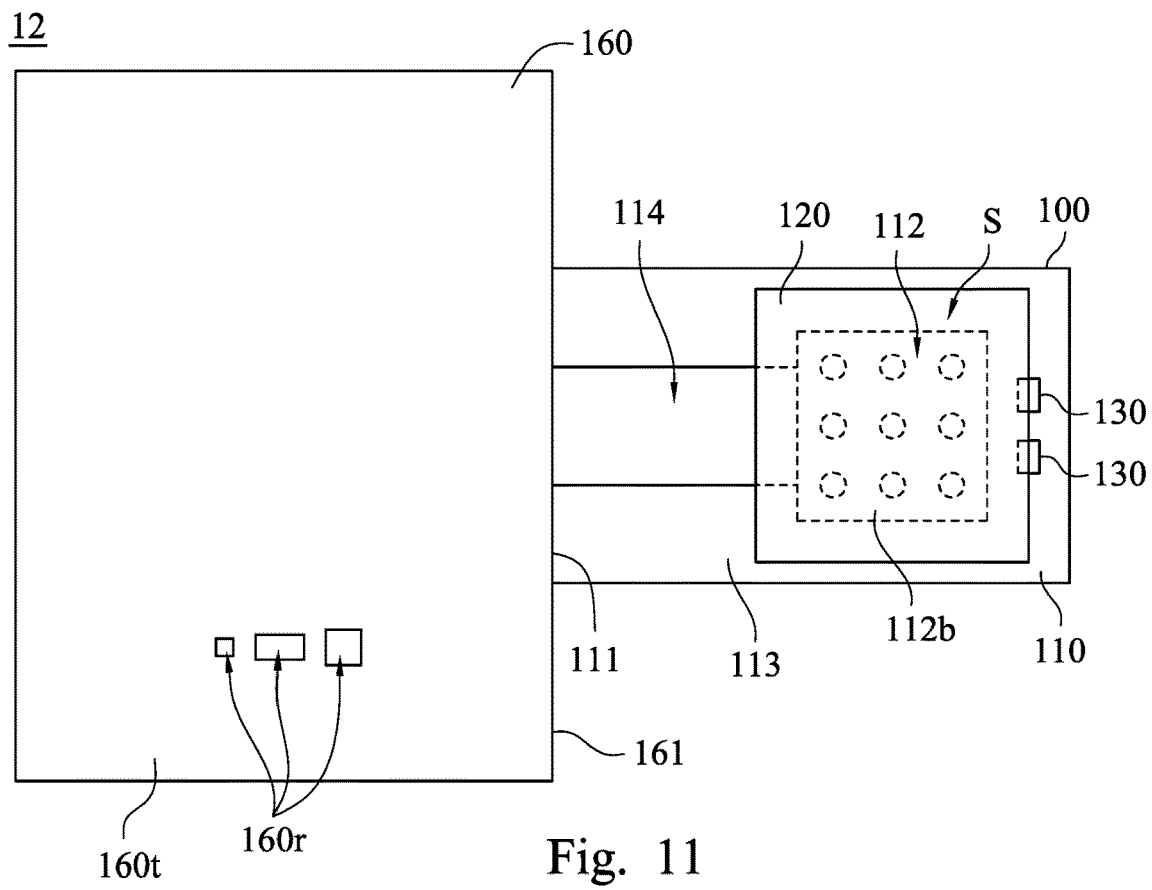
FIG. 11 is a plan view of a test device in accordance with some embodiments.
Figure 12:
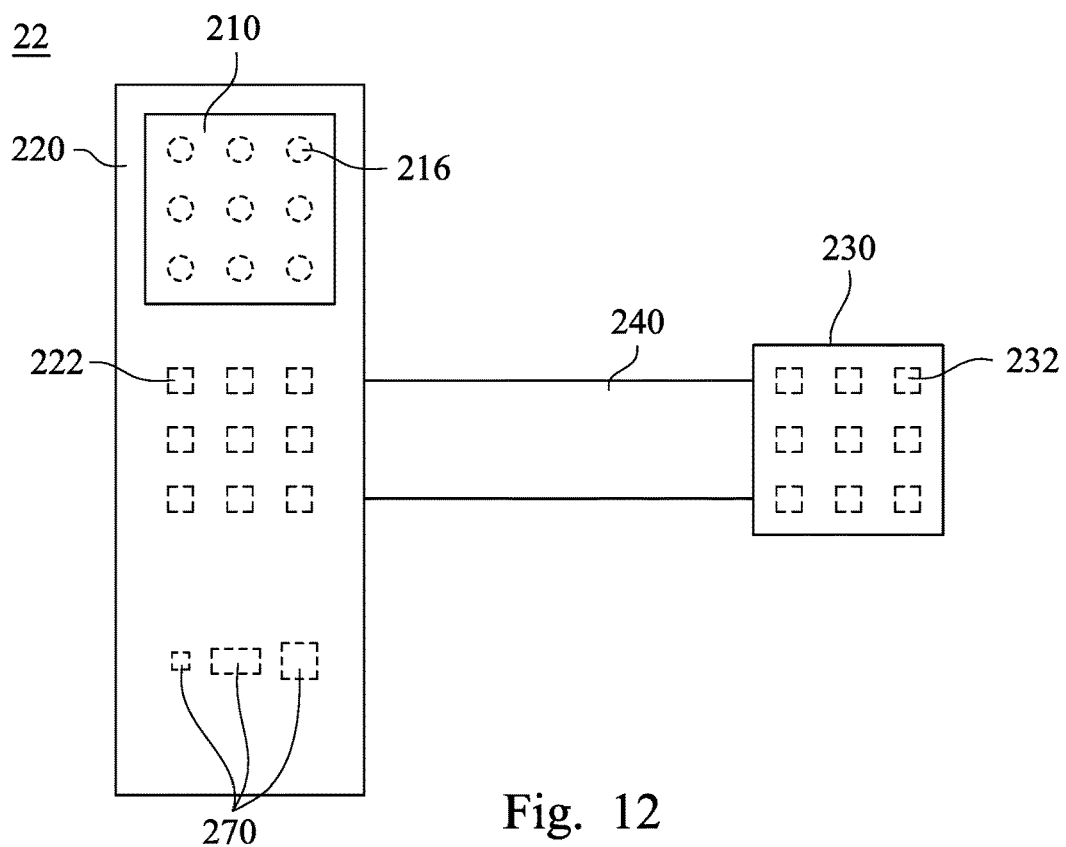
FIG. 12 is a plan view of a semiconductor device that can be tested by the test device shown in FIG. 11.
Figure 13:
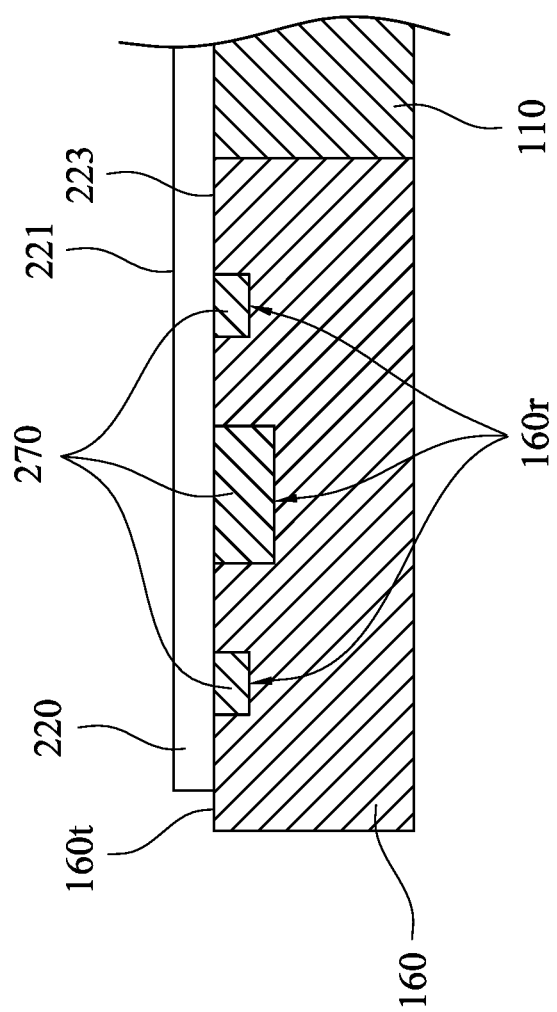
FIG. 13 shows how the semiconductor device in FIG. 12 is placed on the test device in FIG. 11 in accordance with some embodiments of the present disclosure.

FIG. 11 illustrates a test device 12 capable of testing DUT in accordance with some embodiments, and FIG. 12 illustrates a semiconductor device 22 that can be tested by the test device 12. As shown in FIG. 11, the test device 12 includes the test socket 100 and the jig 160 as discussed previously, and moreover, the jig 16 has a plurality of recesses 160r in the top surface 160t of the jig 160. As shown in FIG. 12, the semiconductor device 22 includes the InFO PoP device 210, the circuit board 220, the contact interface 230 and the connector 240 as discussed previously. Moreover, the semiconductor device 22 additionally includes electronic devices 270, such as active devices, passive devices or combinations thereof, mounted to bottom side of the circuit board 220. The electronic devices 270 can be respectively accommodated in the recesses 160r when the semiconductor device 22 is placed on the test device 12, as shown FIG. 13. In some embodiments where the electronic devices 270 are different devices and have different geometries, the recesses 160r can have different geometries to fit the electronic devices 270. By such a configuration, the bottom surface 223 of circuit board 220 can be confomally placed over the top surface 160t of jig 160 even if the electronic devices 270 are raised with respect to the bottom surface 223.

Figure 14:
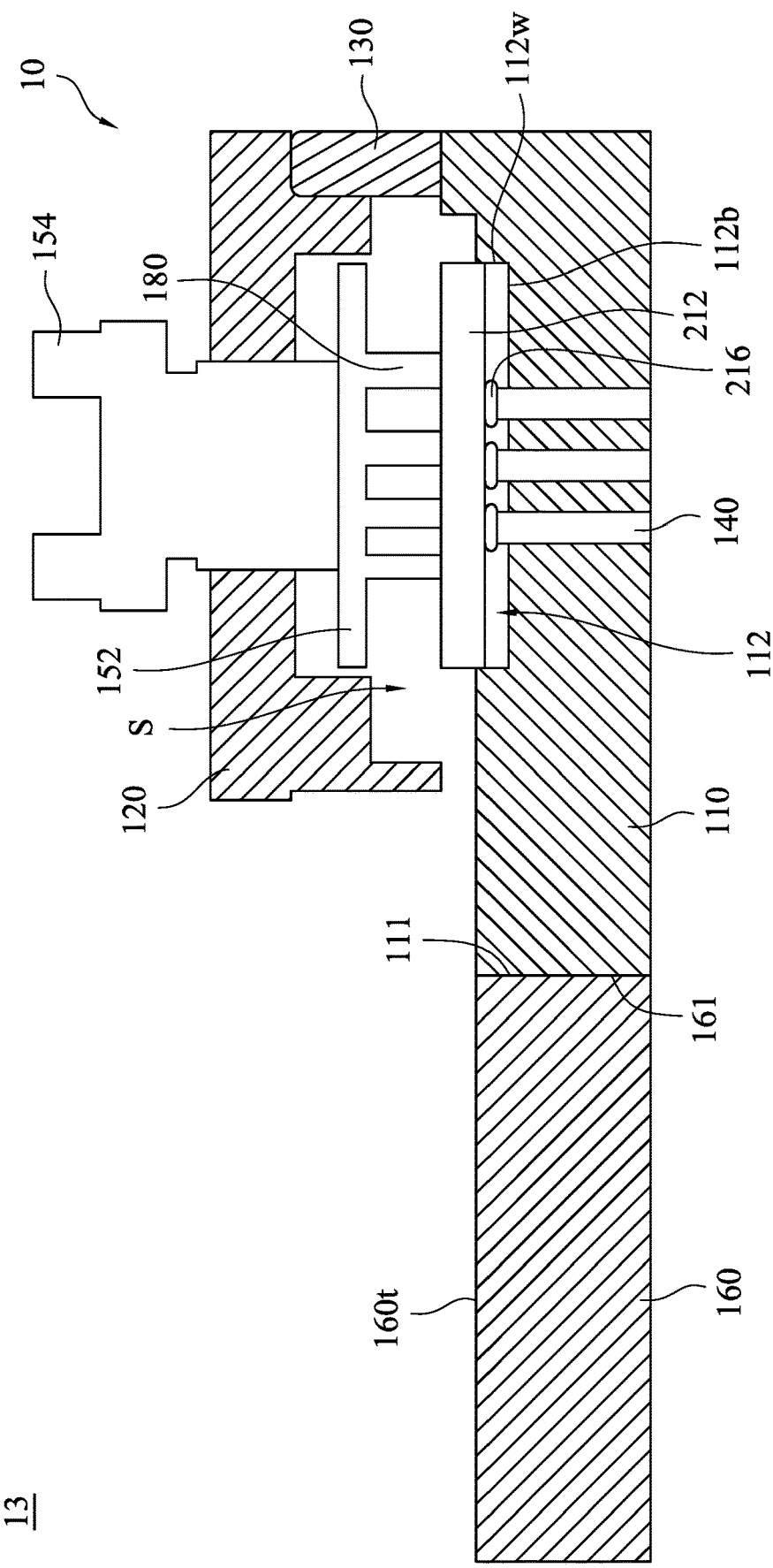
FIG. 14 is a cross-sectional view of a test device capable of testing a TIV package in accordance with some embodiments.
Figure 15:
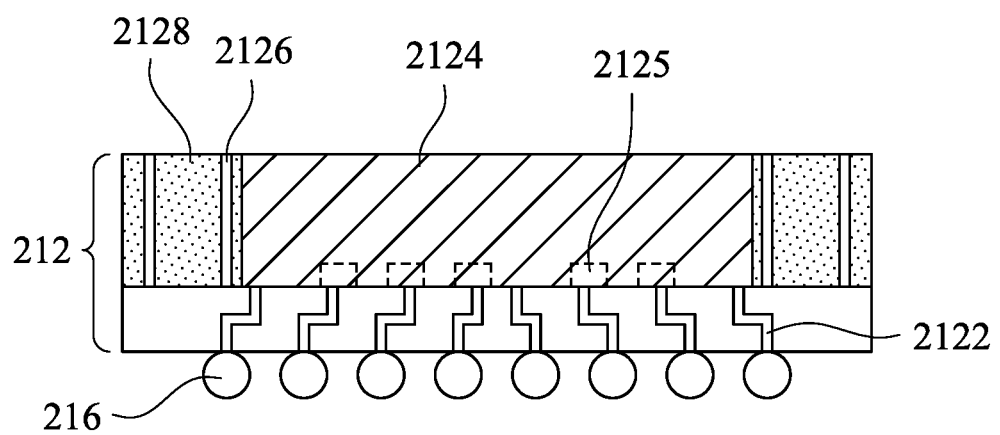
FIG. 15 is a cross-sectional view of a TIV package in accordance with some embodiments.

FIG. 14 illustrates a test device 13 in accordance with some embodiments, in which the test device 13 can additionally test the bottom package 212 of the InFO PoP device 210 before mounting the top package 214. As shown in FIG. 14, the test device 13 includes the test socket 100 and the jig 160 as discussed previously, and moreover, the test device 13 further includes a plurality of top probes 180 affixed to the cover 120. When the bottom package 212 is placed in the test socket 100, the top probes 180 in the accommodating space S can be in contact with contacts on top side of the bottom package 212. For example, in some embodiments where the bottom package 212 is a Through Integrated fan-out Via (TIV) package as shown in FIG. 15, the bottom package 212 includes a plurality of through-vias or TIVs 2126 and a molding compound 2128. The semiconductor chip 2124 is enclosed by or embedded in the molding compound 2128. The TIVs 2126 penetrate through the molding compound 2128 and are electrically connected to the underlying redistribution lines 2122. Top ends of the TIVs 2126 are exposed outside the molding compound 2128. When the bottom package 212 is placed in the test socket 100, the top probes 180 can be respectively in contact with top ends of the TIVs 2126, so as to probe the TIVs 2126. In some embodiments, the top probes 180 are affixed to the pusher 152, and hence the top probes 180 can move downwardly for probing the TIVs 2126. By incorporating the top probes 180, the test device 13 is universally adaptable for testing InFO PoP devices, circuit boards, and TIV packages.

Figure 16:
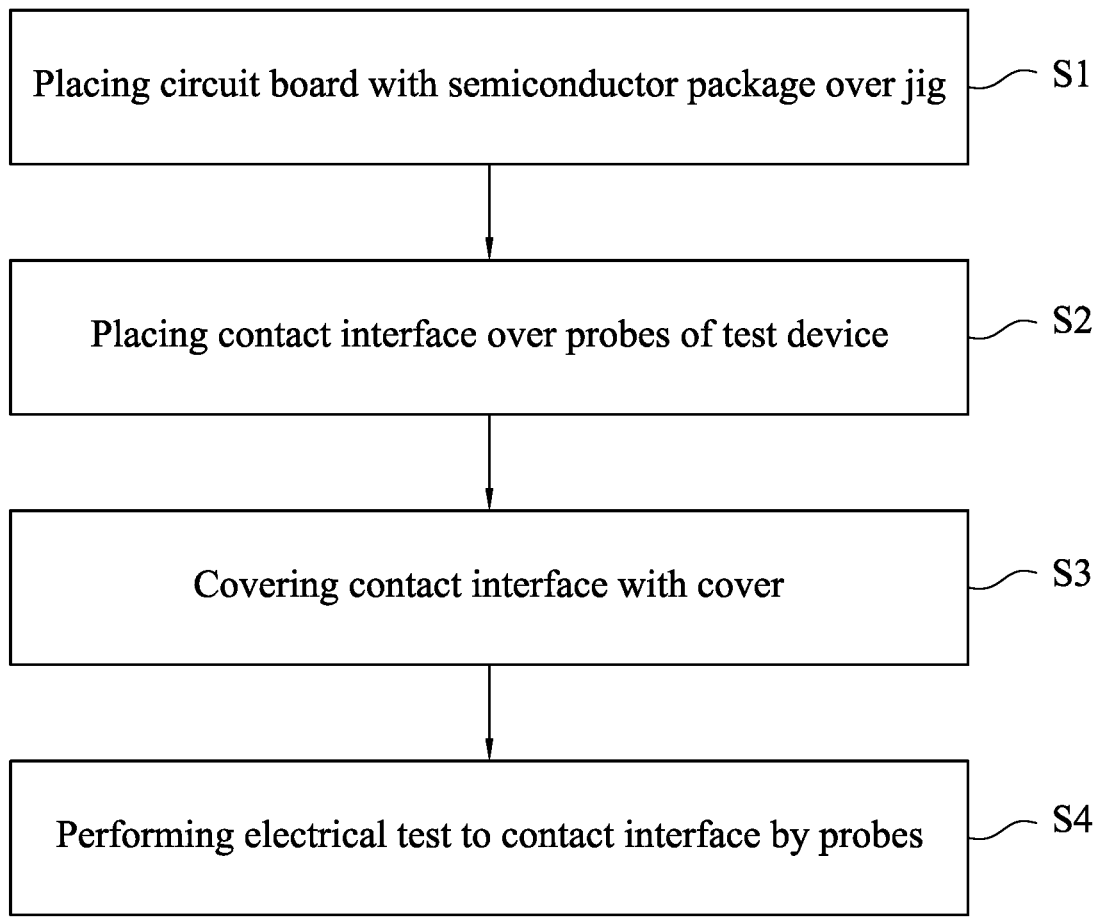
FIG. 16 is a flow chart illustrating a method of testing a DUT.

FIG. 16 is a flow chart illustrating a method of testing DUT, such as the semiconductor device 20 as shown in FIG. 4. In step S1, the circuit board 220 with the semiconductor package 210 mounted thereon is placed over the jig 160. In step S2, the contact interface 230 is placed over the probes 140 of the test device 10 (as shown in FIG. 1). The step S1 can be performed prior to the step S2, and vice versa. Thereafter, in step S3, the contact interface 230 can be covered by the cover 120, while leaving the circuit board 220 outside the space between the cover 120 and probes 140. Afterwards, in step S4, an electrical test can be performed to the contact interface 230 by the probes 140. In other words, the contact pads 232 of the contact interface 230 can be probed by the probes 140, respectively. In some embodiments, the contact pads 232 of the contact interface 230 can be chained together, e.g., using a metal line, to form a chained structure between two end points during testing, and signals can be transmitted through the chained structure including all contact pads 232.

Embodiments of the present disclosure may have at least following advantages. Substantially the same pitch of contact pads of the contact interface and the bottom conductive bumps of the semiconductor package may be advantageous to design or arrange universally adaptable probes for testing either semiconductor packages or circuit board with semiconductor packages thereon. Moreover, the groove in the bottom fixture of the test socket can accommodate the connector between the circuit board and contact interface, so as to prevent damage of electrical connection between the circuit board and contact interface during probing the contact interface.

In accordance with some embodiments, a semiconductor device includes a circuit board, a semiconductor package, and a contact interface. The semiconductor package is mounted on the circuit board. The semiconductor package includes a plurality of conductive bumps with a first pitch. The contact interface is electrically connected to the circuit board. The contact interface includes a plurality of first contact pads with a second pitch substantially the same as the first pitch. The first contact pads are separated from the conductive bumps.

In accordance with some embodiments, a test device includes a jig and a test socket connected to the jig. The test socket includes a fixture, a cover, and a plurality of probes. The fixture has a groove and a first recess in a top surface of the fixture. The groove laterally extends from the first recess to a top surface of the jig. The cover is over the first recess of the fixture and movable with respect to the fixture. The probes are in the first recess.

In accordance with some embodiments, a method of testing a semiconductor device includes placing a circuit board with a semiconductor package over a jig, placing a contact interface extending from the circuit board over probes of a test socket, covering the contact interface over the probes by a cover, and performing an electrical test to the contact interface by the probes.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a circuit board comprising a plurality of first contact pads;
   a semiconductor package mounted on the circuit board, wherein the semiconductor package comprises a plurality of conductive bumps with a first pitch, wherein the conductive bumps are electrically connected to the first contact pads;
   a contact interface electrically connected to the circuit board. wherein the contact interface comprises a plurality of second contact pads with a second pitch substantially the same as the first pitch, and wherein the second contact pads are separated from the conductive bumps;
   an electronic device mounted on the circuit board and spaced apart from the first and second contact pads, wherein the first contact pads are between the semiconductor package and the electronic device; and
   a connector connecting the contact interface to the circuit board, the connector having a longitudinal axis substantially perpendicular to a longest sidewall of the circuit board when viewed from above.

2. The semiconductor device of claim 1, wherein the first contact pads are electrically connected to the second contact pads in a one-to-one manner.

3. The semiconductor device of claim 1, wherein the semiconductor device further comprises:
a plurality of signal channels respectively connecting the second contact pads to the first contact pads.

4. The semiconductor device of claim 1, wherein the connector laterally extends from the circuit board to the contact interface.

5. The semiconductor device of claim 1, further comprising: a plurality of signal lines extending from the second contact pads to the circuit board through the connector.

6. The semiconductor device of claim 1, wherein the connector comprises a plurality of guide features arranged on a major surface of the connector asymmetrically with respect to the longitudinal axis.

7. The semiconductor device of claim 6, wherein the guide features are guide holes in the major surface of the connector.

8. The semiconductor device of claim 1, wherein the semiconductor package and the electronic device are located at opposite sides of the longitudinal axis of the connector.

9. The semiconductor device of claim 1, wherein the semiconductor package comprises:
a semiconductor chip;
a molding compound enclosing the semiconductor chip; and
a plurality of through-vias penetrating through the molding compound.

10. A semiconductor device, comprising:
a circuit board having a top surface and a bottom surface opposite the top surface and separated in a vertical direction, wherein the circuit board comprises a plurality of first contact pads exposed by the bottom surface of the circuit board;
a package-on-package (PoP) device comprising a plurality of conductive bumps mounted on the top surface of the circuit board, wherein the conductive bumps are electrically connected to the first contact pads, and the PoP device is spaced apart from the first contact pads in a horizontal direction perpendicular to the vertical direction;
an electronic device mounted on the circuit board;
a contact interface electrically connected to the circuit board and having the same contour as the PoP device, wherein the contact interface comprises a plurality of second contact pads; and
a connector extending from a sidewall of the contact interface to a sidewall of the circuit board along a longitudinal axis of the connector, wherein the PoP device and the electronic device are located at opposite sides of the longitudinal axis of the connector.

11. The semiconductor device of claim 10, wherein the first contact pads are arranged at a first pitch, wherein the plurality of second contact pads are electrically connected to the conductive bumps and arranged at a second pitch less than the first pitch.

12. The semiconductor device of claim 11, wherein the contact interface comprises a plurality of third contact pads arranged at a third pitch greater than the second pitch.

13. The semiconductor device of claim 12, wherein the conductive bumps are arranged at a fourth pitch greater than the second pitch.

14. The semiconductor device of claim 12, wherein the conductive bumps are arranged at a fourth pitch substantially the same as the second pitch.

15. The semiconductor device of claim 10, wherein the contact interface comprises a plurality of contact pads, and the PoP device comprises:
a semiconductor chip;
a molding compound enclosing the semiconductor chip; and
a plurality of through-vias penetrating through the molding compound, wherein the through-vias are separated by a distance greater than a pitch of the contact pads of the contact interface.

16. The semiconductor device of claim 10, wherein the connector has a top surface and a plurality of guide holes in the top surface, and the guide holes are arranged asymmetrically with respect to the longitudinal axis of the connector when viewed from above.

17. The semiconductor device of claim 10, wherein the electronic device is spaced apart from the first contact pads and the contact interface. board and spaced apart from the second contact pads and the first contact pads.

18. A semiconductor device, comprising:
a circuit board comprising a plurality of first contact pads exposed by a bottom surface of the circuit board, wherein a surface of each of the first contact pads exposed by the bottom surface is flush with the bottom surface of the circuit board;
a semiconductor package mounted on a top surface of the circuit board opposite to the bottom surface;
a contact interface non-overlapping with the circuit board and comprising a plurality of second contact pads;
a connector extending from a first sidewall of the circuit board to a second sidewall of the contact interface along a longitudinal axis substantially perpendicular to the first sidewall of the circuit board when viewed from above, wherein the connector has first guide holes on one side of the longitudinal axis of the connector arranged in a pattern different from that of second guide holes on the other side of the longitudinal axis of the connector;
a plurality of signal channels respectively connecting the second contact pads to the first contact pads; and
an electronic device mounted on the circuit board and spaced apart from the second contact pads and the first contact pads.

19. The semiconductor device of claim 18, wherein the connector has a third sidewall in contact with the second sidewall of the contact interface, and the third sidewall is smaller than the second sidewall.

20. The semiconductor device of claim 18, wherein the contact interface extends past opposing sides of the connector when viewed from above.

* * * * *